(12) United States Patent
Faulkner

(10) Patent No.: US 7,555,089 B2
(45) Date of Patent: Jun. 30, 2009

(54) DATA EDGE-TO-CLOCK EDGE PHASE DETECTOR FOR HIGH SPEED CIRCUITS

(75) Inventor: Raymond G. Faulkner, Treasure Island, FL (US)

(73) Assignee: Honeywell International Inc., Morristown, NJ (US)

( * ) Notice: Subject to any disclaimer, the term of this patent is extended or adjusted under 35 U.S.C. 154(b) by 572 days.

(21) Appl. No.: 11/134,099

(22) Filed: May 20, 2005

(65) Prior Publication Data

US 2006/0262891 A1   Nov. 23, 2006

(51) Int. Cl.
    *H04L 7/00* (2006.01)
(52) U.S. Cl. .................. 375/371; 375/354; 455/516; 327/141
(58) Field of Classification Search .................. 375/371; 455/516
    See application file for complete search history.

(56) References Cited

U.S. PATENT DOCUMENTS

| 4,876,699 | A | 10/1989 | Nelson ...................... 375/82 |
| 5,889,828 | A | 3/1999 | Miyashita et al. ............ 375/374 |
| 6,100,733 | A | 8/2000 | Dortu et al. |
| 6,784,707 | B2 | 8/2004 | Kim et al. |
| 6,856,659 | B1 | 2/2005 | Pierrick ....................... 375/355 |

FOREIGN PATENT DOCUMENTS

EP   0 306 002   8/1988

OTHER PUBLICATIONS

International Search Report PCT/US2005/005196 dated Aug. 16, 2006.
Feng Lin et al., "A Register-Controlled Symmetrical DLL for Double-Data-Rate DRAM," IEEE Journal of Solid-State Circuits, vol. 34, No. 4, Apr. 1999, pp. 565-568.

*Primary Examiner*—David C Payne
*Assistant Examiner*—Leon Flores
(74) *Attorney, Agent, or Firm*—McDonnell Boehnen Hulbert & Berghoff LLP

(57) ABSTRACT

A novel method and system for detecting and synchronizing the skew between a data signal and a reference clock signal are presented. A multiple-phase clock generator is used to create multiple phase-separated clock signals having a common frequency. The multiple clock signals are then utilized to create timing bins, with each timing bin corresponding to a unique sequence of the multiple clock signals. Based on the characteristics of a digital system, the timing bins are separated into valid and invalid timing bins. A data signal received at an interface is processed by determining whether it experiences transitions during valid or invalid timing bins. If a data signal transitions during an invalid timing bin, an error signal may be generated and the link may be retrained by generating test data signals and phase-shifting subsequent data signals such that they transition during valid timing bins.

12 Claims, 5 Drawing Sheets

DATA EDGE-TO-CLOCK EDGE PHASE DETECTOR FOR HIGH SPEED CIRCUITS

STATEMENT REGARDING FEDERALLY SPONSORED RESEARCH

This invention was partially made with U.S. Government support under contract F29601-98-9-0193 awarded by the Air Force Research Laboratory. Accordingly, the government may posses certain rights in the invention.

FIELD

The present invention relates to the field of high-speed integrated circuits. More specifically, the present invention relates to circuits designed to provide accurate phase and sampling window detection in high-speed integrated circuits

BACKGROUND

In digital circuit systems, operation of one or more components may depend upon the state of a synchronization signal, such as a reference clock. In dynamic circuits, one or more reference clocks may be used to direct the flow of data through logical blocks, and may be used to generally increase the predictability of the system. In dynamic random access memory (DRAM) devices and static random access memory (SRAM) devices, a reference clock may be used to determine when data can properly be written to and read from storage. Likewise, data signals received by a digital system input interface must adhere to the timing restraints of the digital system as dictated by the reference clock. However, synchronization of these data signals may be complicated if the links that generate these data signals do not have access to a non-skewed version of the digital system reference clock, as may often be the case.

Generally, a data signal received by a digital circuit must be stable during a certain period of time in order to ensure that the data signal has been properly sampled. In circuits that transition on a single clock edge, this period of stability may need to coincide with the rising or falling edge of the reference clock signal. In circuits that transition on both clock edges, or dual-data rate systems, the period of stability may need to coincide with any reference clock signal transition. An incoming data signal may need to be stable for a certain period of time before the clock edge (known as the setup time), and for a certain period of time after the clock edge (known as the hold time). The setup time and hold time of the system help to define a sampling window during which the data signal is required to be stable. Any transition of the data signal during the sampling window may result in an unknown or incorrect sampling of the data signal.

As the data transmission rates of a circuit increases, the sampling time requirements become increasingly stringent. With a higher data rate, the portion of the data period that is valid for sampling becomes smaller, resulting in diminishing margins for the setup and hold times. As a result, the tolerance for such variations as skew, clock jitter and link noise is also reduced. Clock jitter and link noise are generally addressed at the board level, with a focus on robust designs in clock and coupling techniques to reduce both effects. However, skew (the difference in phase between two signals) may manifest itself in several forms, including data-to-clock skew, and requires more complex solutions.

Data-to-clock skew may result from differences between trace lengths for clock signals and data signals in a board layout. In some cases, this effect is mitigated through static phase alignment techniques, such as attempting to match the length of these traces or adding a fixed phase shift to the clock signal on either the transmitting or receiving interface. Generally, static efforts are difficult to implement and offer relatively few substantial benefits. Specifically, matching trace lengths is a laborious process and may be impossible to implement in complex systems with high pin-counts; likewise adding a fixed phase shift allows for little flexibility in system and board designs. Additionally, most static phase alignment techniques rely heavily upon results from pre-production simulation of the design that can only provide estimations as to actual circuit and board conditions. Furthermore, utilizing simulation results generally fails to provide indications of effects on circuit performance due to process, voltage and temperature variations.

More robust methods of addressing data-to-clock skew employ dynamic phase alignment. Dynamic methods are more capable of handling changes in system behavior due to process, voltage and temperature variations; furthermore, these methods may permit the system to adapt to long-term changes in the behavior of the system. These dynamic methods generally monitor the data-to-clock skew of one or more data signals and then actively respond to correct for any phase synchronization errors. In many cases, the clock signal at the receiving interface is adjusted to be phase-aligned with the data signal. Detection of skew may generally be accomplished through the use of analog phase detectors, whose outputs are converted to digital signals and sent to a logic layer that synchronizes the local clock to the data by generating a phase-shifted version of the local clock. However, these current dynamic phase alignment techniques may require complex circuitry in order to coordinate data received over multiple interfaces. Specifically, because each data trace may have a different amount of skew, each receiving interface must have a separate system for synchronizing the local clock to the data; as a result, each receiving interface may correspond to a version of the local clock with a different phase. In this case, data that is meant to be processed concurrently (i.e. bus data) must be further coordinated and grouped through a serialization system. Additionally, these systems may require the use of multiple analog to digital converters to process data measured by the analog phase detectors, with these converters requiring substantial area for on-chip designs.

It would be desirable to provide an adaptable system that allows for high-speed data communication through the use of dynamic phase-alignment techniques. Furthermore, it would be desirable for this system to operate without the need for multiple analog phase and skew detection devices and analog to digital converters. It would also be desirable for this system to provide dynamic phase-alignment without the need for additional synchronization of bus data due to the use of skewed versions of the local clock. Finally, the system should be robust and able to compensate for variations in manufacturing process, voltage, and temperature, as well as be capable of coping with ionizing and single event radiation effects.

SUMMARY OF THE INVENTION

In general the present invention relates to a system and method for utilizing a multi-phase clock generator for high speed circuit data edge-to-clock edge phase detection and synchronization. In one aspect, the invention relates to a method for detecting data edge-to-clock edge relative phase differences, the method comprising: generating multiple clock signals having differing phases; defining a series of timing bins based on the sequence of the multiple clock signals; assigning the timing bins as occurring during either valid or invalid time intervals; detecting data signal transitions from data signals received over one or more links; and determining if the data signal transitions correspond to valid or invalid timing bins. In another aspect, this method for detecting valid data edge-to-clock edge relative phase differences further comprises initiating a link retraining session if a data signal from a link corresponds to an invalid time segment.

In another aspect, the invention relates to a data edge-to-clock edge phase detection and synchronization system comprising: a multi-phase clock generator that generates multiple clock signals having substantially differing phases; a sequencer that receives the multiple clock signals and determines if the sequence of multiple clock signals corresponds to a series of valid or invalid time segments, one or more links that carry data signals; and a comparator that receives data signals from the one or more links and communicates with the sequencer to determine if the data signals correspond to valid or invalid time segments. In another aspect, this data edge-to-clock edge phase detection and synchronization system further comprises one or more phase variation modules corresponding to the one or more links that may be used to selectively vary the phase of data signals in order to correspond with valid time segments.

BRIEF DESCRIPTION OF THE DRAWINGS

Embodiments of the invention are described below in conjunction with the appended figures, wherein like reference numerals refer to like elements in the various figures, and wherein.

DETAILED DESCRIPTION

The invention provides a framework to solve the problem of detecting the phase of a data signal relative to a reference clock signal. Additionally, the invention provides a framework to adjust the phase of a data signal so that it is synchronized with the phase of a valid sampling window as specified by a reference clock signal. The ability to detect the relative phase and synchronize the data signal and reference clock signal is accomplished in part by the creation of "timing bins." The timing bins are established by partitioning the period of the reference clock signal into multiple portions as defined by multiple clock signals having substantially the same frequency, and separated by different relative phases.

Figure 1:
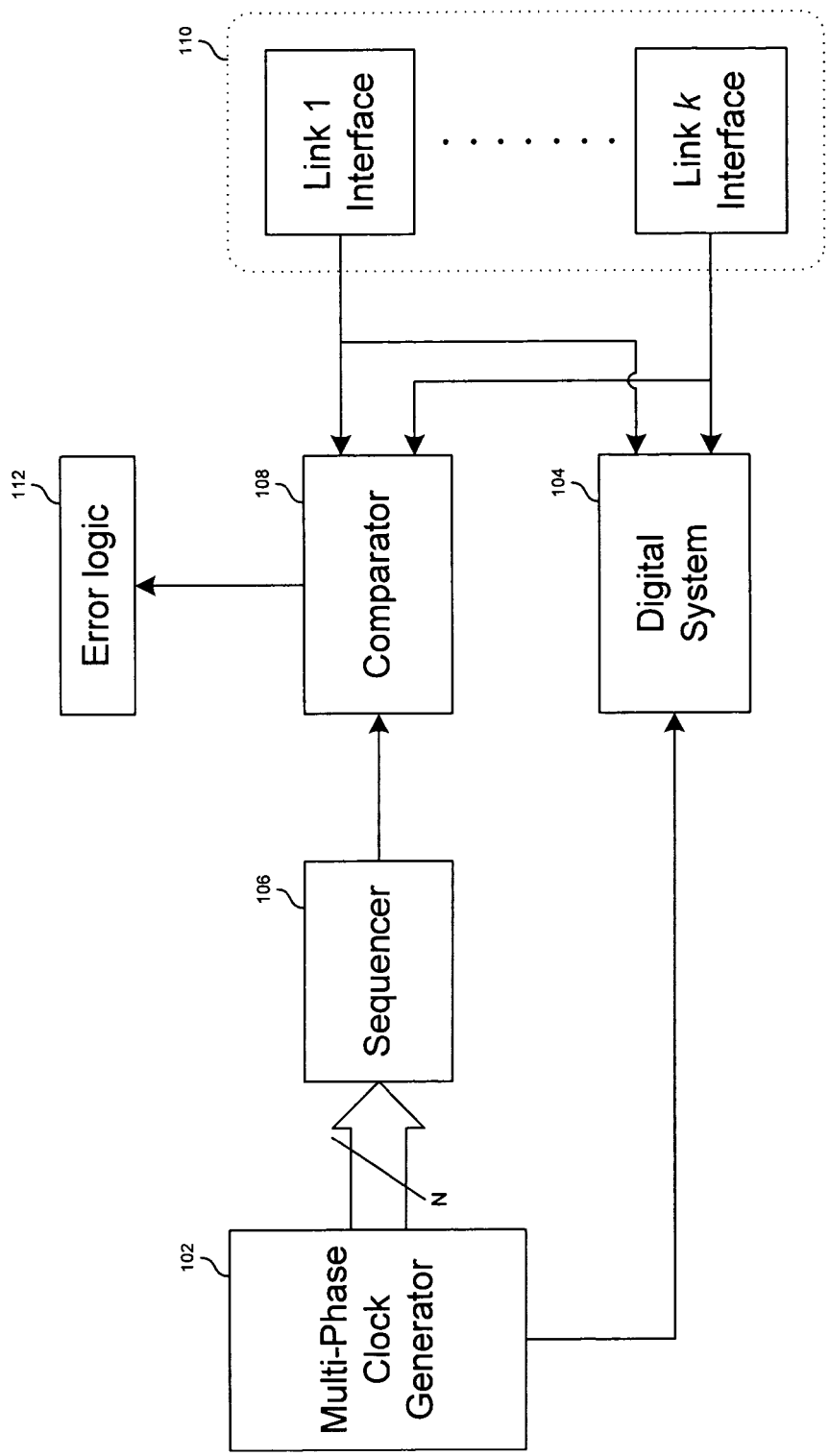
FIG. 1 is a schematic of a data transition edge-to-clock edge relative phase detection system, according to an embodiment.

FIG. 1 shows a schematic of a system for detecting the relative phase of one or more data signals with respect to a reference clock signal. The system comprises a multi-phase clock generator 102 that generates a series of N clock signals having identical frequencies and having different relative phases with respect to one another. The frequency of the signals may be $f$ and have a period of T. In general, the relative separation of phases between adjacent clock signals may be a constant value of $2\pi/N$ radians. One of these N clock signals may be a reference clock signal which represents the actual system clock for a digital system 104 that is receiving data signals. The multi-phase clock generator may be realized by a modified phase-locked loop (PLL) circuit or a modified delay-locked loop (DLL) circuit, as further described below.

Figure 2:
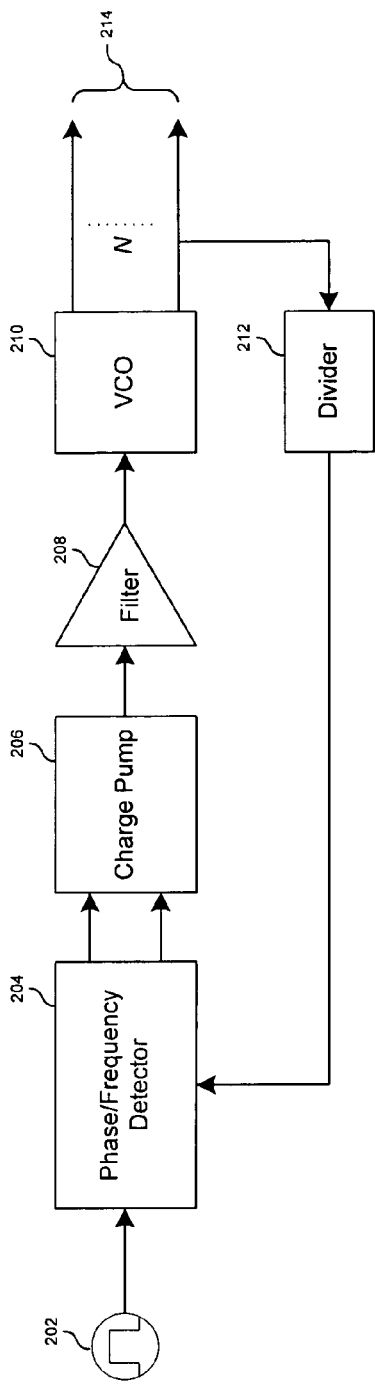
FIG. 2 is a schematic of a phase-locked loop (PLL) system comprising a modified voltage controlled oscillator (VCO) having multiple clock outputs, according to an embodiment.

FIG. 2 shows a schematic of a PLL circuit that may be used to realize the multi-phase clock generator 102. The modified PLL comprises the same components as PLL circuits that are known in the art, but has additional node taps to create multiple clock outputs having different relative phases. The modified PLL circuit comprises a base clock 202 whose frequency is multiplied to provide output clock signals 214 having a substantially higher frequency. The clock signals 214 are generated by a voltage controlled oscillator (VCO) 210 that is capable of providing multiple clock signals whose common frequency may be adjusted by an input control voltage. One of the clock signals 214 output from the VCO 210 may be the reference clock signal utilized by a digital system. This reference clock signal is sent to a divider 212 so that its frequency may be reduced to match that of the base clock 202. Both the divided reference clock signal and the base clock signal are sent to a phase/frequency detector 204 that compares the two signals and may produce an "up" or "down" signal if the divided reference clock signal lags or leads, respectively, the base clock signal. The "up" and "down" indicators are received by a charge pump 206 that translates these indicators into an analog voltage that can be used to control the frequency of the clock signals output by the VCO 210. This analog voltage may first be passed through a low-pass filter 208 to remove high-frequency jitter due to rapid changes associated with the edges of the clock signals.

Figure 3:
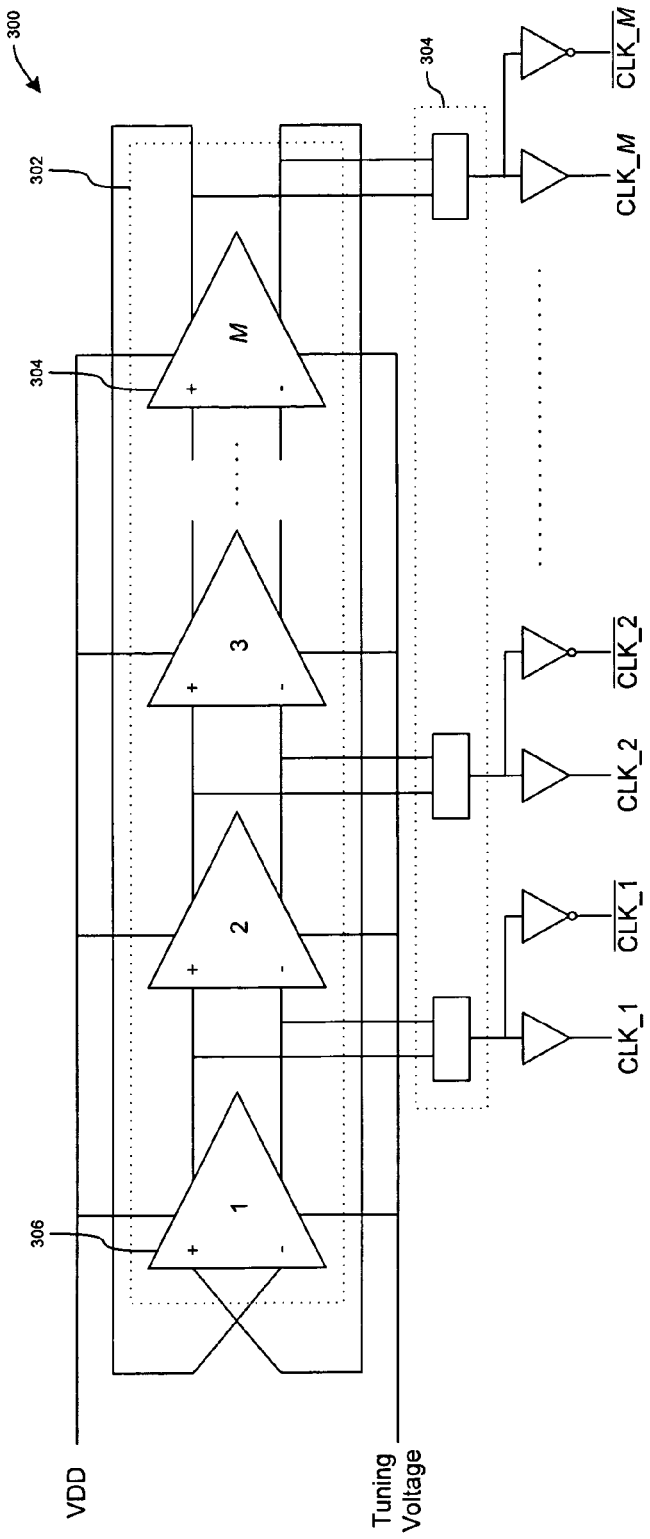
FIG. 3 is a schematic of a VCO comprising an M-element voltage variable differential ring oscillator that may be used to generate a multiple of clock signals having the same frequency, according to an embodiment.

FIG. 3 shows a schematic of a ring oscillator that may be used within a VCO of a PLL. The ring oscillator is a voltage variable differential ring oscillator 300 comprising M differential buffer elements 302, and generates 2M clock outputs each having the same frequency and separated by a phase of $\pi/M$ radians. Each of these differential buffer elements receives a differential voltage input pair and, after a delay, outputs a differential output signal pair. The oscillation is introduced by cross-routing the output differential pair of one of the differential buffer elements. In FIG. 3, the output pair of differential buffer element M 304 is routed to opposite input terminals of the first differential buffer element 306 in order to produce the oscillating behavior of the circuit. The delay introduced by each element is controlled by a tuning voltage, which may be the analog control signal generated by a charge pump in a PLL. Since each of the differential buffer elements 302 receives the same tuning voltage input, the delay introduced by each element is substantially equal. The differential output of each differential buffer element 302 may be tapped and sent to a series of differential rectifiers to provide a set of M true clock signals. Due to the substantially equal delay introduced by each element, each of the true clock signals is separated by a phase of $\pi/M$ radians. Furthermore, a series of inverters may also be used to generate M complementary clock signals from each of the M true clock signals. As a result a total of 2M clock signals each separated by a phase of π/M radians and having a common frequency are generated by the voltage variable differential ring oscillator 300. Furthermore, in this implementation of a VCO the relative phase separation of the clock outputs from the different elements is stable and relatively independent of process, voltage and temperature variation.

Similarly, a DLL circuit such as is known in the art may be used to realize the multi-phase clock generator. Like the modified PLL described above, the outputs of the individual delay elements in the voltage controlled delay circuit of the DLL may be used to provide the multiple clock signals separated by a constant phase and having a common frequency.

Referring to the system of FIG. 1, the N clock signals from the multi-phase clock generator 102 may be sent to a sequencer 106 that interprets the current values of the clock signals and generates a valid signal indicating whether the sequence of clock signal values corresponds to a valid time interval, or sampling window. Each of the different sequences of input clock signals may represent a timing bin for the sequencer 106. There may be a total of N distinct timing bins covering all of the possible separate T/N time intervals over a single period of the reference clock signal. Depending on the position of the timing bin with respect to rising and falling edges of the reference clock signal, and based on various other digital system circuit parameters, the timing bin may either fully coincide with a period of time in which data may be correctly sampled by the digital system 104 (valid time intervals), or at least partially coincide with a period of time in which data may not be correctly sampled by the digital system 104 (invalid time intervals). Timing bins that fully coincide with valid time intervals may be considered "valid timing bins", and those that at least partially coincide with invalid time intervals may be considered "invalid timing bins." The valid signal that is output by the sequencer 106 corresponds to whether the current sequence of clock signals designates a valid timing bin or an invalid timing bin. Additionally, the sequencer may assign a unique sequence value to each timing bin within a complete reference clock signal period in order to provide more specific information regarding the current phase difference between the timing bin and the reference clock signal. By indicating the unique sequence number in addition to providing a single valid signal, the sequencer 106 may specifically provide the current relative phase as associated with each timing bin. Each sequence value may be represented by a set of bits, and may be output by the sequencer 106 as a set of sequence signals.

It should be noted that, because the timing characteristics of a digital system 104 are at least partially determined by its architecture and design parameters, the sampling requirements of the digital system 104 will generally become known through testing and simulation of the digital system prior to the design and implementation of the sequencer 106. As a result, the invalid and valid time intervals will generally be known to the designer and the valid and invalid timing bins may be established during the design of the sequencer 106.

The valid signal is sent to a comparator 108 which also receives data signals from one or more link interfaces 110. The comparator monitors the data signals from the link interfaces 110 and responds to transitions on each of the data signals, which correspond to data signal timing edges. For each data signal transition, the comparator determines if the specific transition occurred during a valid or invalid timing bin as determined by the valid signal from the sequencer 104. If the data signal transition occurred during a valid timing bin, then it can be determined that the link over which the data signal propagated is sufficiently synchronized with the system. However, if the data signal transition occurred during an invalid timing bin, then it can be determined that the link over which the data signal propagated is no longer synchronized with the reference clock of the system, and an alarm signal may be generated by the comparator 108 and sent to error logic 112 so that the system may respond accordingly. Additionally, if the comparator 108 is provided with the timing bin sequence number by the sequencer 106, the comparator 108 may output this sequence number to the error logic 112 as an indication of the data skew, or the actual phase difference between the data signal and the reference clock.

Figure 4:
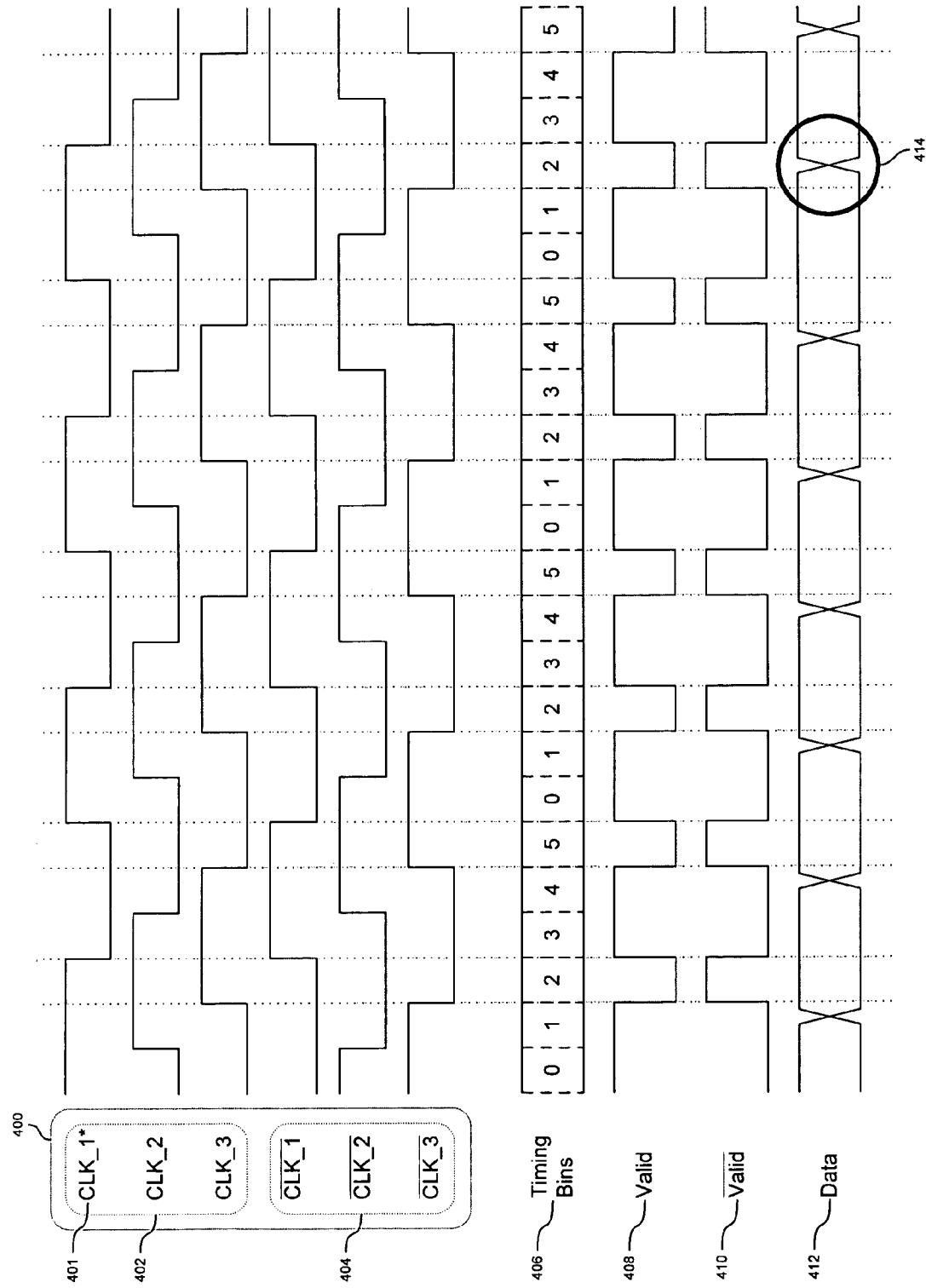
FIG. 4 is a timing diagram illustrating the manner in which timing bins may be used to determine the relative phase difference between the data transition edge and the clock edge in a data transition edge-to-clock edge phase detection system, according to an embodiment.

FIG. 4 shows a timing diagram that illustrates the use of timing bins in order to determine the relative skew of a data signal with respect to a reference clock signal. In the timing diagram shown, six clock signals 400 are generated that create six separate timing bins 406. The clock signals 400 are of identical frequencies and may be represented as three true clock signals 402 separated by phases of π/3 radians along with their respective complements 404. The first clock signal CLK_1 401 may be considered the reference clock signal of the digital system, whose edge (in single data rate logic) or edges (in dual data rate logic) will serve as the reference for determining the relative skew of an incoming data signal. Each sequence of the clock signals 400 designates a unique timing bin, with the six repeating clock sequences designating six distinct timing bins 406. The sequencer may assign a unique sequence value to each timing bin, with the six timing bins 406 receiving sequence values numbered 0 through 5. Of these timing bins 406, those with sequence numbers 2 and 5 are designated as invalid timing bins and are illustrated in FIG. 4 as corresponding to shaded segments of the timing diagram. Corresponding to the valid timing bins are a valid timing signal 408 and its complement 410, which may be generated to determine the data skew of incoming data signals. A sample data signal 412 is shown with several transitions occurring during valid timing bins, or valid transitions. However, after several of these transitions, the phase of the data signal 412 changes and one of the data signal transitions 414 occurs during an invalid timing bin. The change in behavior of the data signal 412 may be a result of a transient radiation event, a change in the environment, a change in the electrical characteristics of the link over which the data signal traveled, or any other event that may have temporarily or permanently affected the delay of the link.

Figure 5:
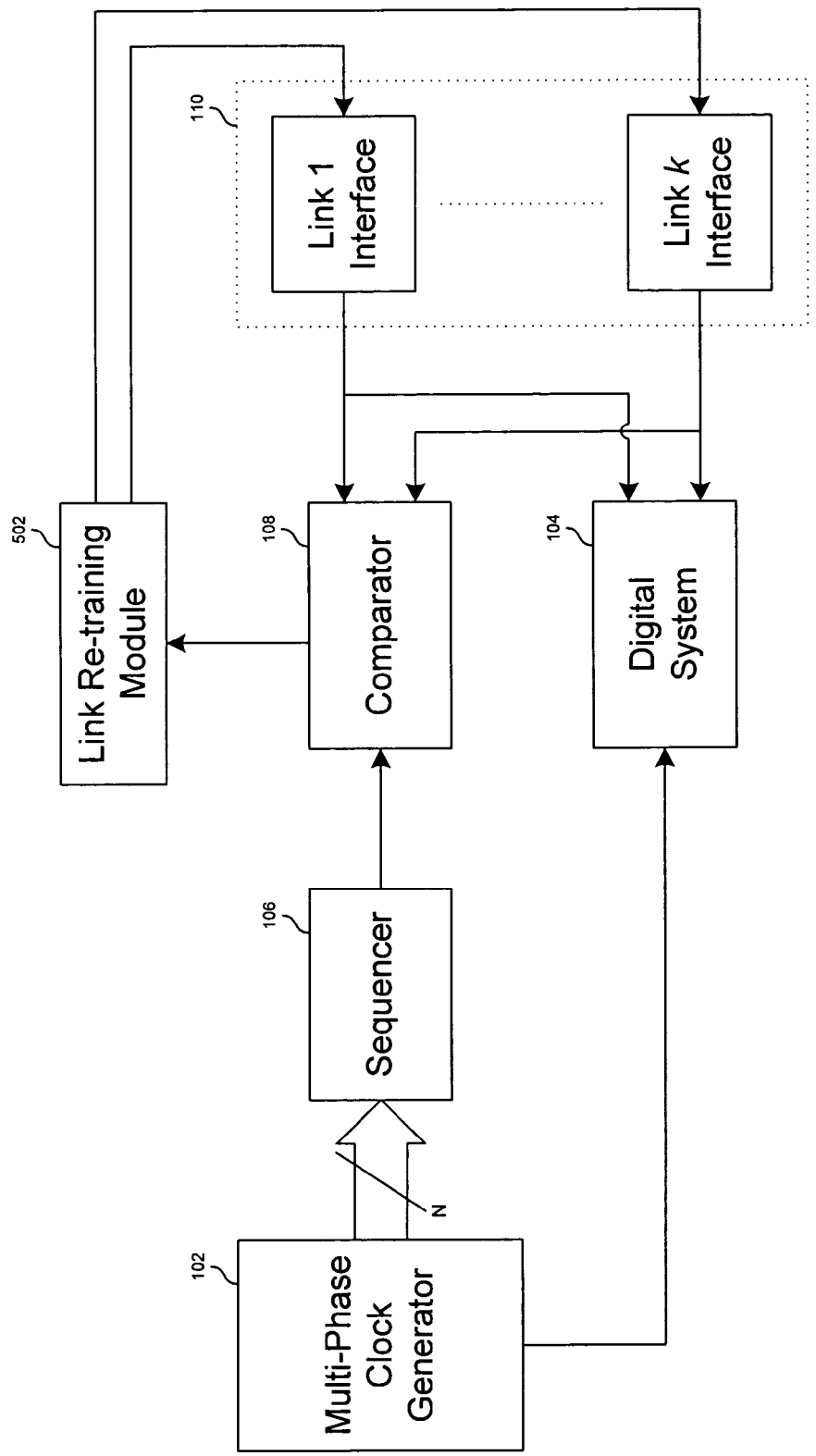
FIG. 5 is a schematic of a data transition edge-to-clock edge relative phase detection and synchronization system, according to an embodiment.

As described above, if a data signal from a given link experiences a transition during an invalid timing bin, an alert corresponding to the given link may be generated by the comparator 108 for the error logic 112. Additionally, this signal may indicate a necessity to re-synchronize the link with the reference clock. FIG. 5 shows a schematic of a system comprising link retraining logic that may be used to retrain a link that has fallen out of synchronization with the reference clock of the digital system. The link retraining module 502 provides feedback to the link interfaces regarding whether a data signal from a given link is transitioning during valid timing bins. This feedback may be used by a link interface to adjust the phase of the link, thereby placing the data signal within the valid sampling window of the reference clock. Adjusting the phase of the link may be accomplished by inserting and varying an artificial delay in the link interface.

Figure 6:
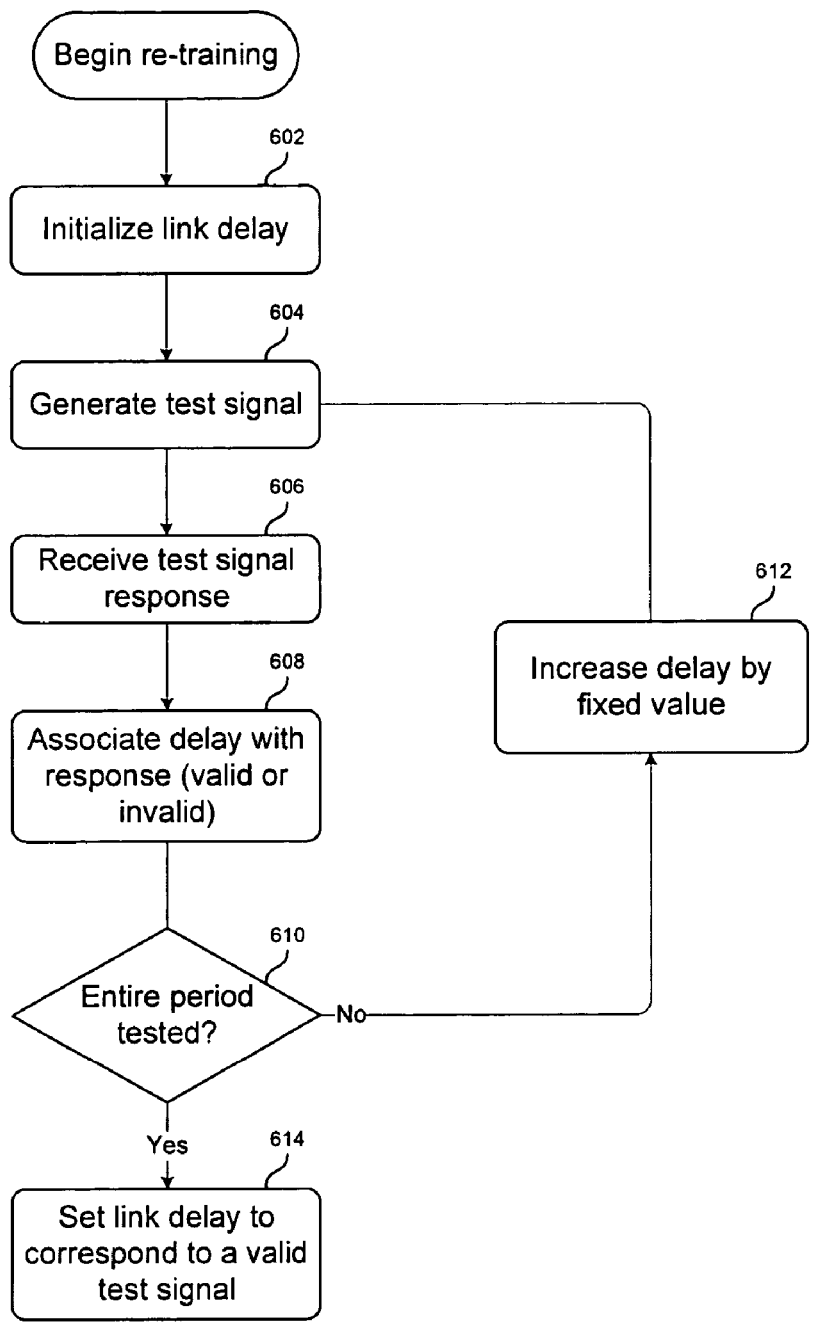
FIG. 6 is a flow diagram illustrating a process of retraining a data link by determining the proper amount of delay in a link that will allow for transitions in valid timing bins, according to an embodiment.

FIG. 6 shows the process that may be used to retrain a link in the event it falls out of synchronization with the reference clock of a system. If the data signal of a link transitions during an invalid timing bin, the link retraining module may generate a control signal to initiate the retraining protocol of the link. To begin the retraining protocol, the link interface may initialize the delay of the variable delay element of the link to zero 602, thereby eliminating any artificially induced phase adjustments. The system may then generate a test data signal over the link 604. A comparator may receive the test data signal and determine whether it has transitioned during a valid or invalid timing bin 606. The result (either valid or invalid) is returned to the link retraining logic, which associates this result with the current amount of delay used in generating the test signal 608. The link delay is then associated as either being valid or invalid, depending upon the result of the comparator. It is then determined if a substantial portion of the clock period has been tested during the retraining process. In one embodiment, the entire reference clock period may be tested; in another embodiment, the delay may simply be adjusted until the first valid variable delay is found. If it is determined that a sufficient portion of the relative phases have not been examined 610, then the link may increase the amount of delay introduced in the link 612, thereby adjusting the phase of the data signal, and generate another test signal. Once results for the various delays have been found, the link may adjust the variable delay element to a valid delay 614 and resume normal operation.

Implementing the link retraining module provides a closed feedback loop that enables the system to continually adjust the delay elements of various links to maintain stable operation during transient changes to environmental variables and permanent changes to link delays over time. Additionally, this system is robust in that single event transient effects will, in the worst case, only initiate a link retraining session. Furthermore, it should be noted that the use of the timing bins as described eliminates the need for an analog to digital conversion of any analog phase measurements.

Exemplary embodiments of the present invention relating to a system and method for detecting and synchronizing data edge-to-clock edge skew have been presented. It should be noted that the figures are not necessarily drawn to scale and are illustrative approximations of their respective embodiments. Similarly, it should also be noted that more significant changes in configuration are also possible and intended to be within the scope of the system taught herein. For example, lines of communication shown between modules in the schematic diagrams are not intended to be limiting, and alternative lines of communication between system components may exist.

It should be understood that the programs, processes, methods, and apparatus described herein are not related or limited to any particular type of processor, computer, or network apparatus (hardware or software), unless otherwise indicated. Various types of general purpose or specialized processors, or computer apparatus may be used with or perform operations in accordance with the teachings described herein. While various elements of the preferred embodiments may have been described as being implemented in hardware, in other embodiments software or firmware implementations may alternatively be used, and vice-versa.

Finally, in view of the wide variety of embodiments to which the principles of the present invention can be applied, it should be understood that the illustrated embodiments are exemplary only, and should not be taken as limiting the scope and spirit of the present invention. For example, the steps of the flow diagrams may be taken in sequences other than those described, and more, fewer, or other elements may be used in the block diagrams. Likewise, the claims should not be read as limited to the described order or elements unless stated to that effect. It will be understood that variations in form and detail may be made to the invention without deviating from the spirit and scope of the invention, as defined by the following claims.

I claim:

1. A method of establishing and adjusting the relative phase between a clock signal transition and a data signal transition, the method comprising: creating multiple clock signals having the same frequency, wherein each clock signal has a different relative phase; establishing a series of timing bins according to the clock signals; dividing the series of timing bins into valid timing bins and invalid timing bins; receiving a data signal having a data transition from a link interface, wherein the data signal has a data phase; and determining whether the data transition occurred during a valid timing bin or an invalid timing bin, wherein when it is determined that the data transition occurred during an invalid timing bin, initiating a retraining process comprising: generating a series of test signals at the link interface, wherein each test signal has a transition, and wherein each test signal has different phase; receiving each test signal at a destination; determining whether each test signal has a transition during a valid timing bin or an invalid timing bin; classifying each test signal as a valid test signal only when the test signal transitions during a valid timing bin; and instructing the link interface to set the data phase to the phase of a valid test signal.

2. The method of claim 1 wherein each timing bin corresponds to a unique sequence of the multiple clock signals.

3. The method of claim 2 wherein each timing bin originates on the rising edge of one of the clock signals and terminates on the rising edge of the clock signal having the subsequent relative phase.

4. The method of claim 1 wherein each of the multiple clock signals has a phase separation of $2\pi/N$ radians, and wherein N is the number of clock signals.

5. The method of claim 1 wherein the retraining process further comprises:
adjusting the delay of the link interface to set the data phase to the phase of a valid test signal.

6. A system for determining and synchronizing the relative phase between a reference clock signal at a receiver and a data signal received by the receiver, the system comprising: a multiple-phase clock generator that generates a multiple of clock signals having substantially identical frequencies, wherein each clock signal has a different relative phase; a sequencer that receives the clock signals, maintains a set of valid and invalid timing bins, and outputs a bin validity signal indicating whether the input sequence of clock signals corresponds to a valid bin or an invalid bin; and a comparator that receives the bin validity signal and the data signal, and outputs a control signal that indicates whether the data signal is transitioning during a valid period of time; a link retraining module that receives the control signal, when the control signal indicates that the data signal is transitioning during an invalid period of time, initializing a link retraining process whereby a series of test signals with multiples phase delays are generated and determined to transition during a valid or invalid period of time, the phase delay of the test signal transitioning during a valid period of time being applied to the data signal.

7. The system of claim 6 wherein each timing bin corresponds to a unique sequence of the clock signals.

8. The system of claim 7 wherein the sequencer designates each timing bin as either valid or invalid.

9. The system of claim 6 wherein the comparator monitors the data signal for a data signal transition, and determines the state of the bin validity signal during a data signal transition.

10. The system of claim 6 wherein the multiple-phase clock generator comprises a phase-locked-loop (PLL) circuit.

11. The system of claim 10 wherein the PLL circuit comprises a voltage variable differential ring oscillator.

12. The system of claim 6 wherein the multiple-phase clock generator comprises a delay-locked-loop (DLL) circuit.

* * * * *